US009404953B2

(12) United States Patent
Chen et al.

(10) Patent No.: US 9,404,953 B2
(45) Date of Patent: Aug. 2, 2016

(54) STRUCTURES AND METHODS FOR MONITORING DIELECTRIC RELIABILITY WITH THROUGH-SILICON VIAS

(71) Applicant: International Business Machines Corporation, Armonk, NY (US)

(72) Inventors: Fen Chen, Williston, VT (US); Mukta G. Farooq, Hopewell Junction, NY (US); John A. Griesemer, Salt Point, NY (US); Chandrasekharan Kothandaraman, Hopewell Junction, NY (US); John Matthew Safran, Wappingers Falls, NY (US); Timothy Dooling Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 14/068,273

(22) Filed: Oct. 31, 2013

(65) Prior Publication Data
US 2015/0115982 A1    Apr. 30, 2015

(51) Int. Cl.
G01R 27/26 (2006.01)
H01L 21/66 (2006.01)
G01R 31/28 (2006.01)

(52) U.S. Cl.
CPC ........ G01R 27/2605 (2013.01); G01R 27/2617 (2013.01); G01R 31/2856 (2013.01); H01L 22/34 (2013.01); G01R 31/2884 (2013.01); H01L 22/14 (2013.01)

(58) Field of Classification Search
CPC ........... G01R 27/2605; G01R 27/2617; G01R 31/2856; G01R 31/2884; G01R 31/00; H01L 22/34; H01L 22/14; H01L 22/30; H01L 24/02; H01L 25/0657; H01L 2225/06541; H01L 2225/06544; H01L 2225/06548; H01L 2225/06555; H01L 2225/06562; H01L 21/77; G01B 7/003
USPC .............................. 324/679; 438/18, 667, 672
See application file for complete search history.

(56) References Cited

U.S. PATENT DOCUMENTS 7,250,311 B2   7/2007 Aoki et al.
7,388,224 B2   6/2008 Filippi et al.
(Continued)

FOREIGN PATENT DOCUMENTS

CN   103187399 A  *  7/2013  ............. G01N 3/066

OTHER PUBLICATIONS

Junhong et al, CN 103187399, "Through-silicon via (TSV) testing structure and TSV testing method"; English Machine Translation; Published Jul. 3, 2013.*
Jiwoo Pak et al.; Modeling of Electromigration in Through-Silicon-Via Based 3D IC; Proc. 2011 Electronic Components and Technology Conference; pp. 1420-1427, 2011.
(Continued)

*Primary Examiner* — Melissa Koval
*Assistant Examiner* — Felicia Farrow
(74) *Attorney, Agent, or Firm* — Steven J. Meyers; Howard M. Cohn (57) ABSTRACT

Embodiments of the present invention provide a variety of structures and method for detecting abnormalities in the back-end-of-line (BEOL) stack and BEOL structures located in close proximity to through-silicon vias (TSVs) in a 3D integrated chip. The detected abnormalities may include stress, strain, and damage that will affect metallization continuity, interfacial integrity within a metal level, proximity accuracy of the TSV placement, and interlevel dielectric integrity and metallization-to-TSV dielectric integrity. Additionally, these structures in conjunction with each other are capable of determining the range of influence of the TSV. That is, how close to the TSV that a BEOL line (or via) needs to be in order to be influenced by the TSV.

12 Claims, 9 Drawing Sheets

(56) References Cited

U.S. PATENT DOCUMENTS

| | | |
|---|---|---|
| 7,888,776 B2 | 2/2011 | Ogawa et al. |
| 2011/0101347 A1* | 5/2011 | Henderson ............ G01N 3/066 257/48 |
| 2013/0135004 A1* | 5/2013 | Hashimoto .... G01R 31/318513 324/762.03 |
| 2014/0332973 A1* | 11/2014 | Ding ...................... H01L 22/14 257/774 |

OTHER PUBLICATIONS

Yu; A Study of Through-Silicon-Via (TSV) Induced Transistor Variation; MS Thesis Dissertation, Massachusetts Institute of Technology; 2011.

D.Y. Chen et al.; Enabling 3D-IC Foundry Technologies for 28 nm Node and Beyond: Through-Silicon-Via Integration With High Throughput Die-to-Wafer Stacking; Proc. Electron Devices Meeting (IEDM), 2009 IEEE International; pp. 1-4, 2009.

* cited by examiner

STRUCTURES AND METHODS FOR MONITORING DIELECTRIC RELIABILITY WITH THROUGH-SILICON VIAS

FIELD OF THE INVENTION

The present invention relates generally to semiconductor fabrication, and more particularly, to test structures for monitoring dielectric reliability with through-silicon vias.

BACKGROUND OF THE INVENTION

Three-dimensional integrated circuits (3DIC), enable increased circuit density, which is well suited to the requirements of modern electronic devices. In many cases, through-silicon vias (TSV) are being used to stack the dies together and to connect the dies to package substrates.

A through-silicon-via, or TSV, provides electrical continuity between the top and bottom surfaces of a semiconductor chip. A TSV is fabricated by deep etching into the silicon wafer, or substrate, which comprises the semiconductor chip, and filling the resulting hole with a liner and a metal filling. The silicon substrate is then ground, or thinned, from the backside until the metal filling is exposed, and backside metal (BSM) is disposed on the thinned backside surface for electrical contact. TSVs are an important part of 3D integrated circuits. It is therefore desirable to have improved structures and methods for testing 3D integrated circuits that utilize TSVs.

SUMMARY OF THE INVENTION

In a first aspect, embodiments of the present invention provide a through-silicon via (TSV) test structure comprising: a TSV disposed in a semiconductor substrate; and a plurality of multilevel test structures disposed adjacent to the TSV, wherein each of the plurality of multilevel test structures occupies at least two metallization levels.

In a second aspect, embodiments of the present invention provide an integrated circuit comprising: a non-transitory memory; a processor configured and disposed to access the non-transitory memory; a bias control circuit; a measurement circuit; a TSV test structure comprising: a TSV disposed in a semiconductor substrate; and a plurality of multilevel test structures disposed adjacent to the TSV, wherein each of the plurality of multilevel test structures occupies at least two metallization levels; and wherein the plurality of multilevel test structures are connected to the measurement circuit, and wherein the bias control circuit is configured and disposed to route an electric current through the TSV.

In a third aspect, embodiments of the present invention provide a method for determining proximity effects for a through-silicon via (TSV), comprising measuring a first multilevel test structure's capacitance of a TSV test structure, wherein the TSV test structure comprises a TSV; measuring a second multilevel test structure's capacitance of the TSV test structure, wherein the second multilevel test structure has a different TSV distance than the first multilevel test structure; computing a difference between the first capacitance and the second capacitance; and deriving a proximity effect factor based on the computed difference.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGS) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Embodiments of the present invention provide a variety of structures and method for detecting abnormalities in the back-end-of-line (BEOL) stack and BEOL structures located in close proximity to through-silicon vias (TSVs) in a 3D integrated chip. The detected abnormalities may include stress, strain, and damage that will affect metallization continuity, interfacial integrity within a metal level, proximity accuracy of the TSV placement, and interlevel dielectric integrity and metallization-to-TSV dielectric integrity. Additionally, these structures in conjunction with each other are capable of determining the range of influence of the TSV. That is, how close to the TSV that a BEOL line (or via) needs to be in order to be influenced by the TSV. Applications for the structures include line monitoring, reliability monitoring, and reliability testing.

Figure 1:
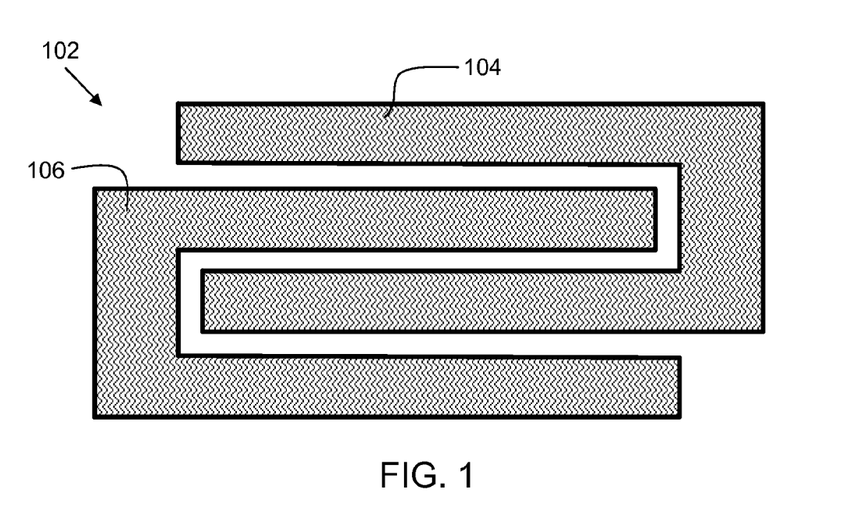
FIG. 1 shows a top-down view of a planar first section of a component of a TSV test structure in accordance with embodiments of the present invention.

FIG. 1 shows a top-down view of a planar first section 102 of a component of a TSV test structure in accordance with embodiments of the present invention. First section 102 is comprised of metal trace 104 and metal trace 106, which are arranged in a serpentine configuration, in which metal trace 104 and metal trace 106 are both "U-shaped" and oriented opposing each other and interleaved with each other. The first section 102 is formed in a metallization layer that is part of the back-end-of-line (BEOL) stack of an integrated circuit.

Figure 2:
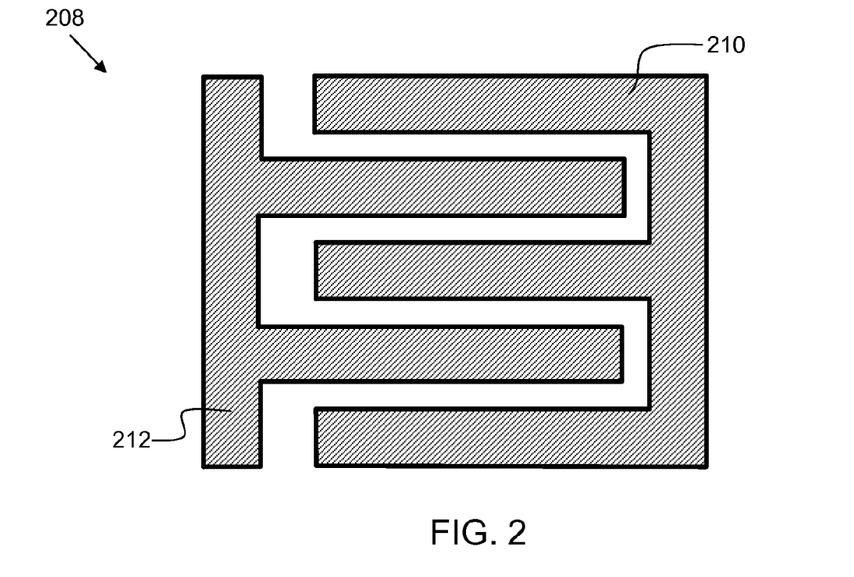
FIG. 2 shows a top-down view of a planar second section of a component of a TSV test structure in accordance with embodiments of the present invention.

FIG. 2 shows a top-down view of a planar second section 208 of a component of a TSV test structure in accordance with embodiments of the present invention. Second section 208 is comprised of metal trace 210 and metal trace 212, which are arranged in a interleaved comb configuration, in which metal trace 210 and metal trace 212 are both "comb-shaped" and oriented opposing each other and interleaved with each other. The second section 208 is formed in a metallization layer that is part of the back-end-of-line (BEOL) stack of an integrated circuit.

Figure 3A:
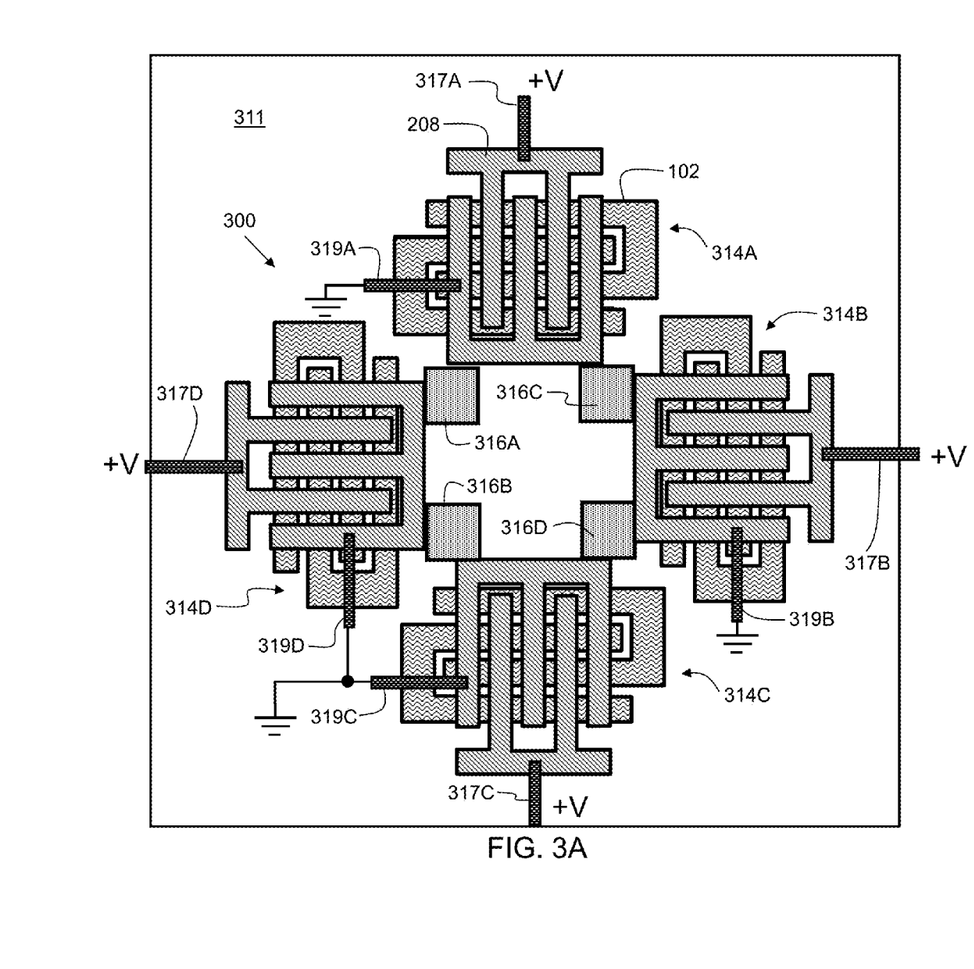
FIG. 3A and FIG. 3B show a top-down view of a TSV test structure in accordance with embodiments of the present invention.

FIG. 3A shows a TSV test structure 300 in accordance with embodiments of the present invention. TSV test structure 300 comprises an array of four TSVs formed in a semiconductor substrate 311, indicated as 316A, 316B, 316C, and 316D (referred to generally as 316). Adjacent to the TSVs are four multilevel capacitive test structures, indicated as 314A, 314B, 314C, and 314D (referred to generally as 314). Referring now to multilevel capacitive test structure 314A, each multilevel test structure is comprised of a first section 102 (as detailed in FIG. 1) and a second section 208 (as detailed in FIG. 2). The first section 102 and second section 208 for each multilevel capacitive test structure may be formed in adjacent metallization levels. For example, in a BEOL stack, there may be many metallization levels (e.g. 10-20 levels), and in some embodiments, the first section 102 is at metallization level 5 and the second section 208 is at metallization level 6. In general, the first section is at metallization level M, and the second section is at metallization level M+1. Hence, each multilevel capacitive test structure 314 comprises an adjacent multi-plate structure that occupies at least two metallization levels.

The multilevel capacitive test structure 314 comprises at least two plates on a first metallization level and at least two plates on a second metallization level, wherein the second metallization level is adjacent to the first metallization level.

To use TSV test structure 300, capacitance measurements are taken from each multilevel capacitive test structure 314. Each multilevel test structure 314 has a ground contact (shown generally as 319), and a positive voltage contact (shown generally as 317). Capacitance measurements may be taken between the two metal traces of the first section, the two metal traces of the second section, and/or between one of the traces of the first section and one of the traces of the second section. The capacitance measured may be compared to a similar set of four multilevel capacitive test structures that are not proximal to a TSV array. The capacitance values with and without a TSV nearby are compared, and the difference in capacitance may be used to derive a proximity effect factor that quantifies the impact of the TSV on neighboring dielectric regions. This information can be beneficial both in the initial development of integrated circuits, as well as during the manufacturing process and/or during operation of an integrated circuit.

Figure 3B:
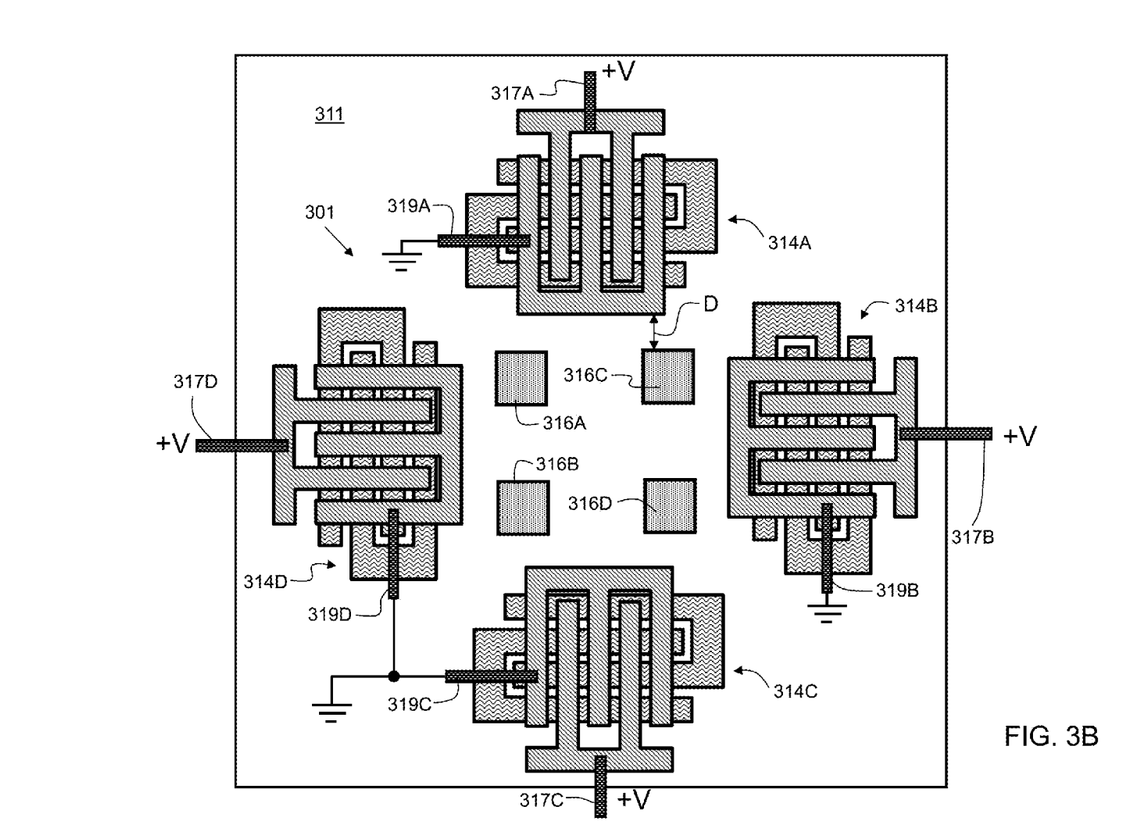

FIG. 3B shows a test structure 301 that is similar to test structure 300 of FIG. 3A, except that each multilevel capacitive test structure 314 is moved a distance D from the TSVs 316. In embodiments of the present invention, measurements may be taken on a TSV test structure such as 300 of FIG. 3A, and also from a test structure such as 301 of FIG. 3B. In this way, a change in capacitance as a function of distance from the TSVs can be obtained. In embodiments, the change in capacitance may be used to compute a proximity effect factor P. The proximity effect factor is a quantitative representation of the effect of TSVs on adjacent dielectric levels in the BEOL stack. The proximity effect factor may be used in a variety of applications, such as in quantifying layout designs, in-situ monitoring of a fabrication process, and monitoring the health of an integrated circuit during operation. In its simplest form, the proximity effect factor P is a function of capacitance change, and distance:

$$P = f(\Delta C, D)$$

In alternative embodiments, a temporal factor may also be used, such that the proximity effect factor is a function of capacitance change, distance, and time:

$$P = f(\Delta C, D, T)$$

In embodiments, a bias current may be applied to the TSV prior to taking the capacitance measurements. The use of a bias current can better simulate real-world operating conditions, as TSVs may typically have a current passing through them during operation of a functional integrated circuit. In embodiments, after applying bias, a first set of measurements may be taken at a first time, and then a second set of measurements are taken from the same test points at a second time. The change in capacitance of the same test points over time may also be used in deriving the proximity effect factor P.

In an exemplary embodiment, four measurements are used (M1, M2, M3, M4). Two test structures are used, one having a distance D1, and another having a distance D2, regarding the distance of the multilevel capacitive test structures to the TSVs. Additionally, two measurement times are used (T1 and T2), such that a change in capacitance over both distance (from the TSV) and time (between measurements T1 and T2) is used in the computation of the proximity effect factor P. In the exemplary embodiments, the measurements are defined as follows:

$$M1 = T1D1$$

$$M2 = T1D2$$

$$M3 = T2D1$$

$$M4 = T2D2$$

For example, measurement M1 is performed on the test structure having distance D1, at time T1, and measurement M2 is performed on the test structure having distance D2, at time T1, and so on. The proximity effect function P may be computed as:

$$P = |A(M3-M4)| - |B(M2-M1)|$$

Where A and B are scaling factors.

In embodiments, A and B may be constants. Other embodiments may use more complex scaling factors, including, but not limited to, logarithmic and/or exponential scaling factors. Furthermore, the formula presented above is merely intended to be exemplary. Other formulas for computing a proximity effect function may be possible. While the above example utilized two test structures, other embodiments may use more than two test structures. In some embodiments, methods may include measuring a third capacitance of a third TSV test structure, and computing a difference between the second capacitance and the third capacitance. The multilevel capacitive test structures shown in FIGS. 1-3 are just one type of capacitive test structure. Other embodiments may use different types of capacitive test structures, as described below. Furthermore, while the embodiments of FIG. 3A and FIG. 3B show an array of four TSVs (316A-316D), other embodiments may have more or fewer TSVs in the test structure. For example, some embodiments may have one TSV, other embodiments may have 9 TSVs per test structure.

Figure 4:
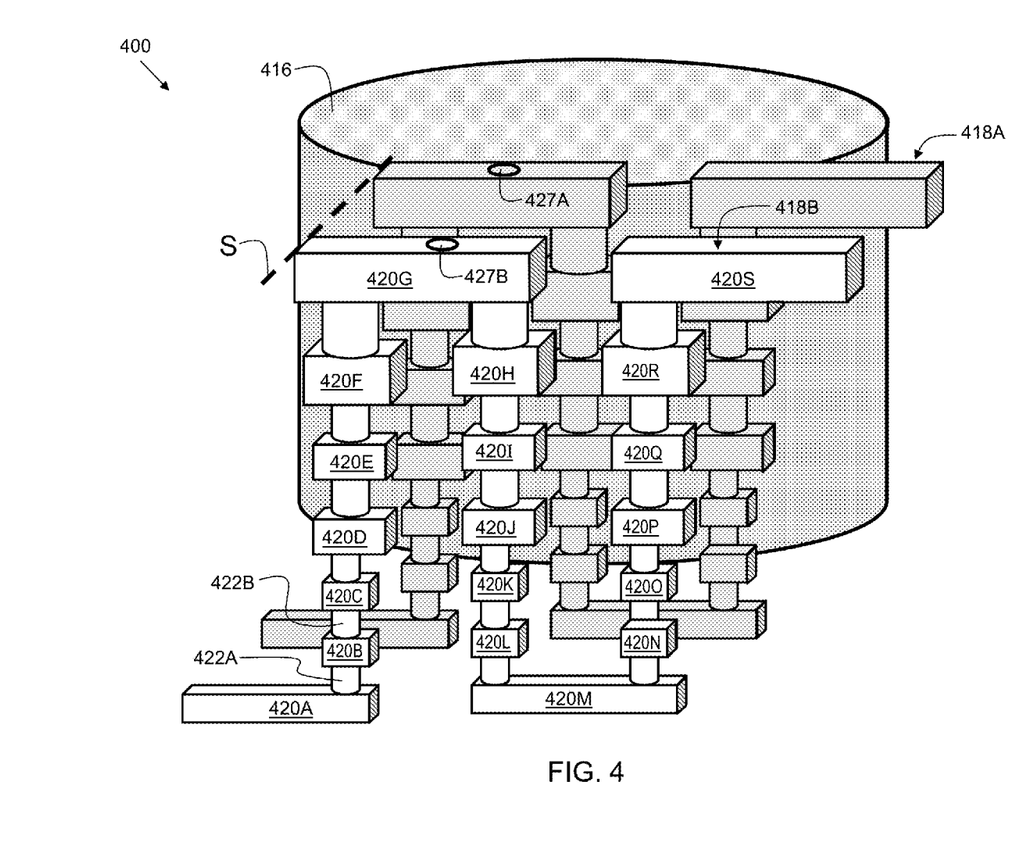
FIG. 4 shows a detailed view of a stacked-via chain pair in a non-staggered configuration in accordance with embodiments of the present invention.

FIG. 4 shows a detailed view of test structure 400 comprising stacked-via chains in a non-staggered configuration in accordance with embodiments of the present invention. Test structure 418A is a first stacked-via chain, and test structure 418B is a second stacked-via chain, both in proximity to TSV 416. The stacked-via chains (referred to generally as 418), comprise a plurality of vias and traces configured in a series connection. Referring now to stacked-via chain 418B, a plurality of metal traces (420A-420S) are connected in series by using multiple via layers (for illustrative clarity, only via layers 422A and 422B are referenced). As can be seen in FIG. 4, the metal traces (420A-420S) are in a series configuration. Stacked-via chains 418A and 418B are configured in a non-staggered configuration, and are both aligned with line S. A capacitance measurement between similar points on each test structure may be performed. For example, a capacitive measurement may be taken between point 427A and 427B. In practice, contacts may be formed on points 427A and 427B to form a connection to probe pads (not shown) for utilizing test equipment to measure the capacitance. In addition to measuring capacitance between first stacked-via chain 418A and second stacked-via chain 418B, in this embodiment, resistance measurements may also be taken. Due to the serial configuration, a resistance or continuity measurement may be taken between intermediate points within the same stacked-via chain. For example, a resistance measurement may be made between metal trace 420A and metal trace 420S. In this way, other problems such as open circuits proximal to the TSV 416 may be detected. In some embodiments, the measurements used include initial continuity measurements and subsequent continuity measurements after thermal cycling and elevated temperature bake of the integrated circuit under test.

Figure 5:
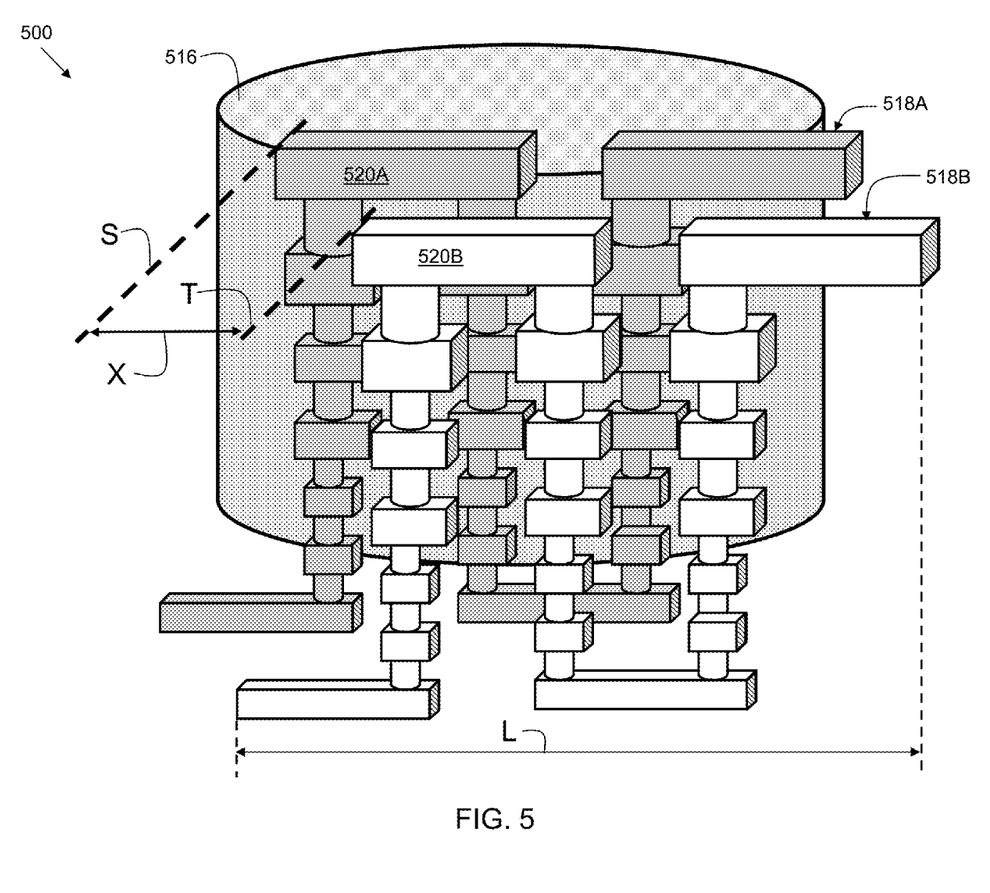
FIG. 5 shows a detailed view of a stacked-via chain pair in a staggered configuration in accordance with alternative embodiments of the present invention.

FIG. 5 shows a detailed view of a test structure 500 comprising stacked-via chains in a staggered configuration in accordance with alternative embodiments of the present invention. Test structure 500 is similar to test structure 400, except that it is in a staggered configuration such that stacked-via chain 518B, which is aligned with line T, is offset by a distance X from stacked via chain 518A, which is aligned with line S. Stacked-via chain 518B is offset from stacked-via chain 518A by a distance X, as measured from an edge of metal trace 520A of stacked-via chain 518A, to a corresponding edge of metal trace 520B of stacked-via chain 518B. In some embodiments, distance X may range from about 25% to about 50% of the total length L of the stacked-via chain. In some embodiments, multiple test structures may be used with varying degrees of offset. A variety of offsets may be useful in detecting certain conditions, such as sensitivity to overlay error. This can serve as valuable information for integrated circuit designers.

Figure 6:
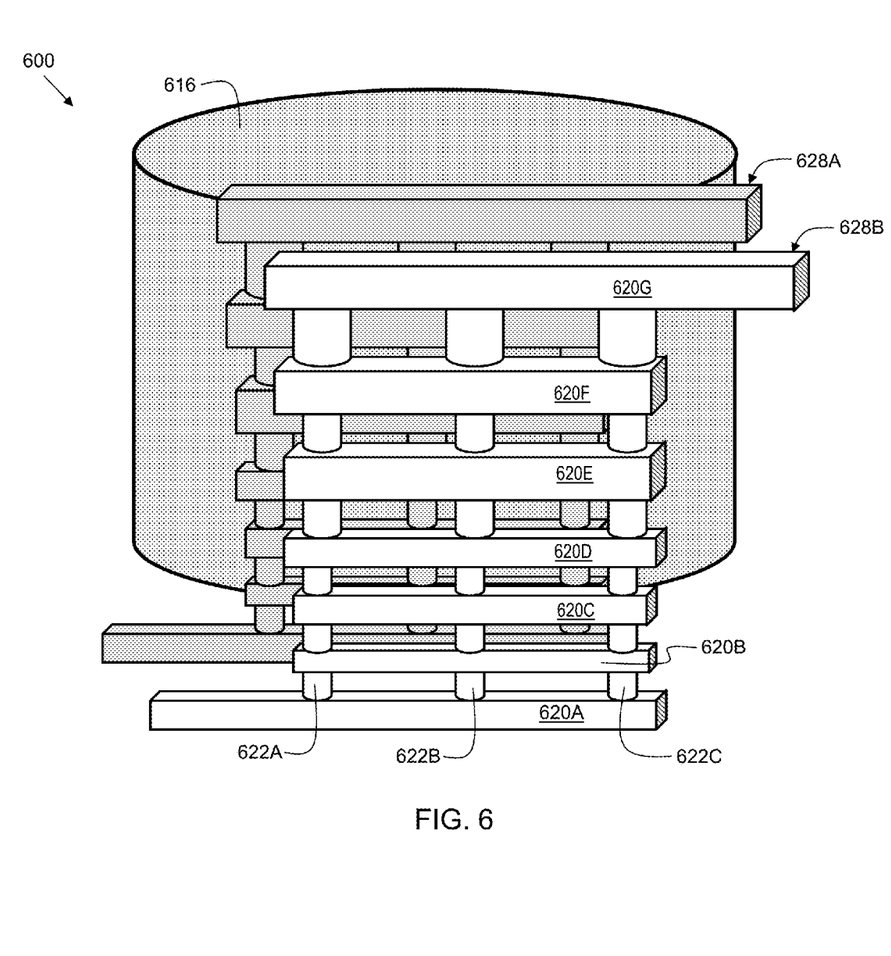
FIG. 6 shows a detailed view of a stacked-via comb in accordance with embodiments of the present invention.

FIG. 6 shows a detailed view of a test structure 600 of a stacked-via comb in accordance with embodiments of the present invention. Two stacked-via comb structures (628A and 628B, and referred to generally as 628) are disposed in the proximity of a TSV 616. The stacked-via comb 628 comprises a plurality of vias and traces configured in a parallel connection. For example, metal trace 620A is connected in parallel to metal trace 620B by vias 622A, 622B, and 622C. Similarly, metal traces 620C, 620D, 620E, 620F, and 620G are also connected in parallel by vias. For the sake of illustrative clarity, not all of the vias are labeled with reference numbers. Embodiments of the present invention may comprise staggered stacked-via combs with varying offset levels similar to as previously described for the embodiment of FIG. 5 (which shows a staggered configuration). Similarly, embodiments of the present invention may also comprise non-staggered stacked-via combs, similar to FIG. 4, which shows a non-staggered configuration.

Figure 7:
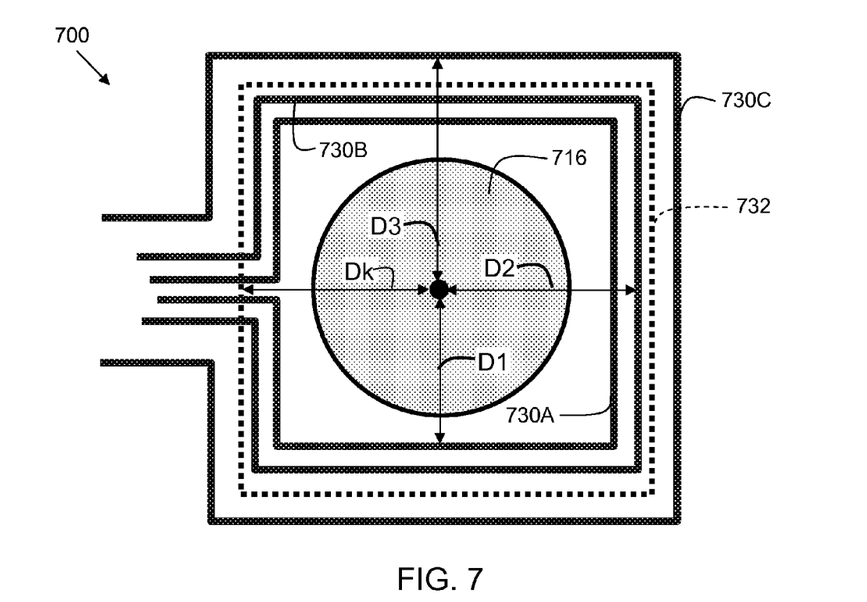
FIG. 7 shows a TSV test structure in accordance with alternative embodiments of the present invention.

FIG. 7 shows a TSV test structure 700 in accordance with alternative embodiments of the present invention. In this embodiment, a plurality of multilevel test structures, indicated as 730A, 730B, and 730C, are arranged concentrically around TSV 716, and wherein each multilevel test structure has a unique TSV distance (D1, D2, and D3). In particular, for test structure 700, each multilevel test structure (730A, 730B, and 730C) is in a square configuration around TSV 716. Test structures 730A, 730B, and 730C may be of the stacked-via chain type as shown in FIG. 4, or may be of the stacked-via comb type as shown in FIG. 6. Each multilevel test structure has a different minimum distance from the center of TSV 716. Multilevel test structure 730A has a distance D1 from the TSV center. Multilevel test structure 730B has a distance D2 from the TSV center. Multilevel test structure 730C has a distance D3 from the TSV center. In some embodiments, D1 may range from about 150 nanometers to about 250 nanometers, D2 may range from about 600 nanometers to about 800 nanometers, and D3 may range from about 1.3 micrometers to about 2 micrometers. Other ranges are possible. Furthermore, some embodiments may utilize more or fewer test structures. Therefore some embodiments may further comprise additional distances. In some cases the distances may be several micrometers from the TSV center, to fully characterize the proximity effect, and determine at which distance, the effects of the presence of the TSV become negligible. A keep-out zone 732 may be defined around the TSV 716. The keep-out-zone of a TSV typically denotes a region where placement of vias and metal lines is prohibited, in order to reduce the risk of damage to the various insulating layers and diffusion barrier layers that may be used to line the TSV, and serve to isolate the TSV from the silicon substrate in which it is formed. In embodiments, a first subset of the plurality of multilevel test structures (e.g. 730A and 730B) is disposed on the inside of a keep-out zone of the TSV. The keep-out zone 732 has a minimum distance Dk, and in the embodiment shown in FIGS. 7, D1 and D2 are less than Dk. Similarly, a second subset of the plurality of multilevel test structures (e.g. 730C) is disposed outside a keep-out zone of the TSV. Hence, D3 is larger than Dk. In this way, the effectiveness of the keep-out zone 732 may be ascertained through experimentation. Hence, the keep-out zone can be adjusted based on empirical data collected from test structures such as those shown in FIG. 7. The keep-out zone may then be adjusted for use in data structures such as unit cells used in EDA (electronic design automation) tools.

Figure 8:
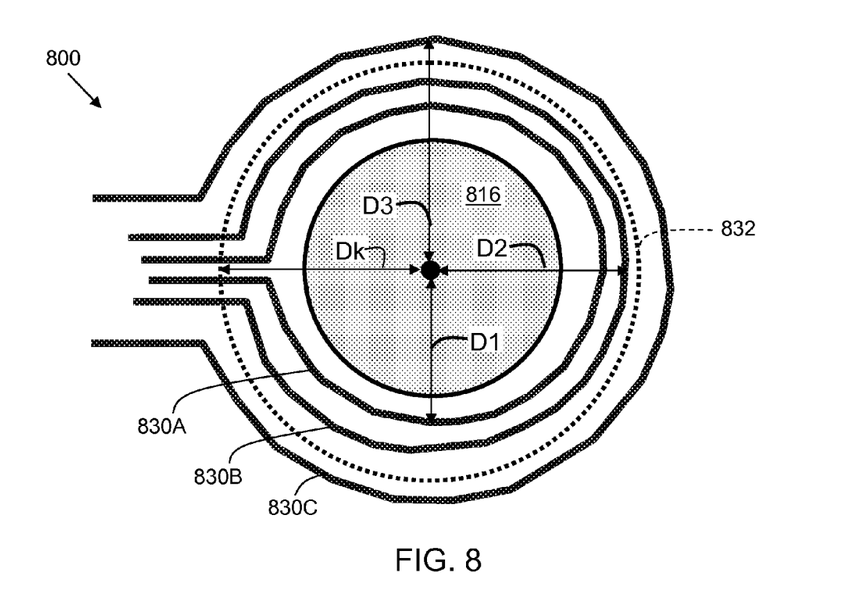
FIG. 8 shows a TSV test structure in accordance with alternative embodiments of the present invention.

FIG. 8 shows a TSV test structure 800 in accordance with alternative embodiments of the present invention. The test structure 800 of FIG. 8 is similar to that of FIG. 7, except that the plurality of multilevel test structures (830A, 830B, and 830C) are arranged in a conformal configuration wherein the test structures are substantially circular around the circumference of the TSV 816.

Figure 9:
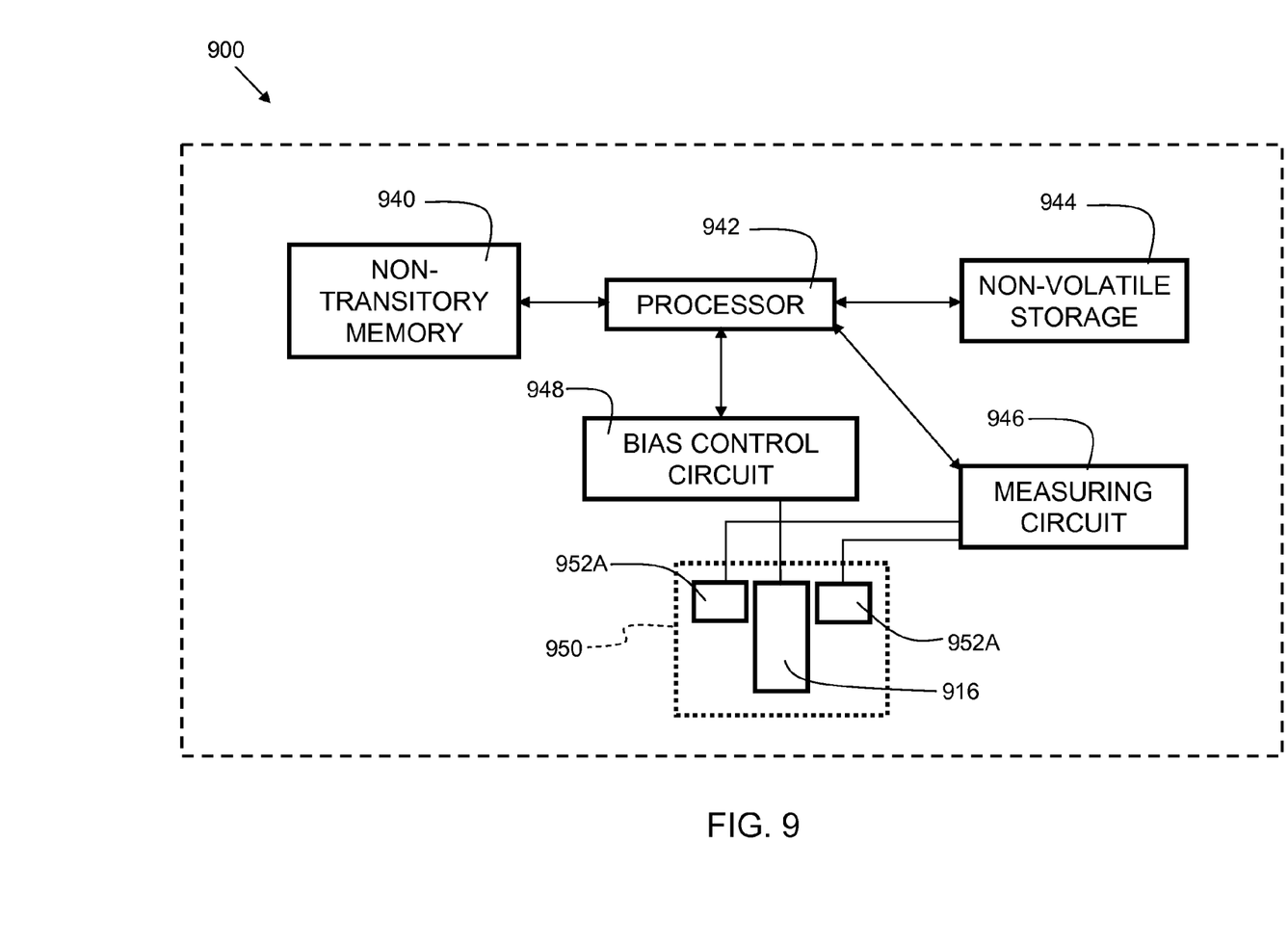
FIG. 9 shows a block diagram of an integrated circuit in accordance with embodiments of the present invention.

FIG. 9 shows a block diagram of an integrated circuit 900 in accordance with embodiments of the present invention. Embodiments of integrated circuit 900 can provide a real-time TSV reliability mechanism for 3D integrated circuits. TSV test structures are measured over time, and an indication is generated in response to significant change in capacitance values. These embodiments have applications where high reliability is needed. These applications include medical and space applications, among others.

Integrated circuit 900 comprises processor 942 which is configured and disposed to access non-transitory memory 940. Non-transitory memory 940 may comprise flash, SRAM, or other suitable technology. Additionally, non-volatile storage 944 provides storage of data across power-cycles of integrated circuit 900. In embodiments, non-volatile storage 944 may also comprise flash, SRAM, or other suitable technology. Integrated circuit 900 further comprises TSV test structure 950, which includes a TSV 916, and multilevel capacitive test structures 952A and 952B. Processor 942 is configured to control a bias control circuit 948 to route current through TSV 916 prior to starting capacitive measurements. Processor 942 is further configured to control a measuring circuit 946 in order to perform the capacitive measurements of multilevel capacitive test structures 952A and 952B. Non-transitory memory 940 contains instructions, which when executed by processor 942, perform various functions to periodically monitor the TSV test structure, and generate an indication if the measurements have changed beyond a predetermined amount over a predetermined time interval. In some embodiments, a proximity effect factor may be computed on a regular basis, and may be recorded into non-volatile storage 944. In other embodiments, a simple capacitance measurement may be recorded into non-volatile storage 944. In some embodiments, multiple measurements of capacitance and/or proximity effect factor values may be stored in non-volatile memory to log a history of the measurements. If the measurements fall outside of a predetermined range, the processor 942 indicates a warning condition. The indication may be in the form of execution of an interrupt service routine, and/or updating a status value in a register that is implemented within processor 942. Note that while only one TSV test structure 950 is illustrated in FIG. 9, in practice, more than one TSV test structure may be used within integrated circuit 900.

Figure 10:
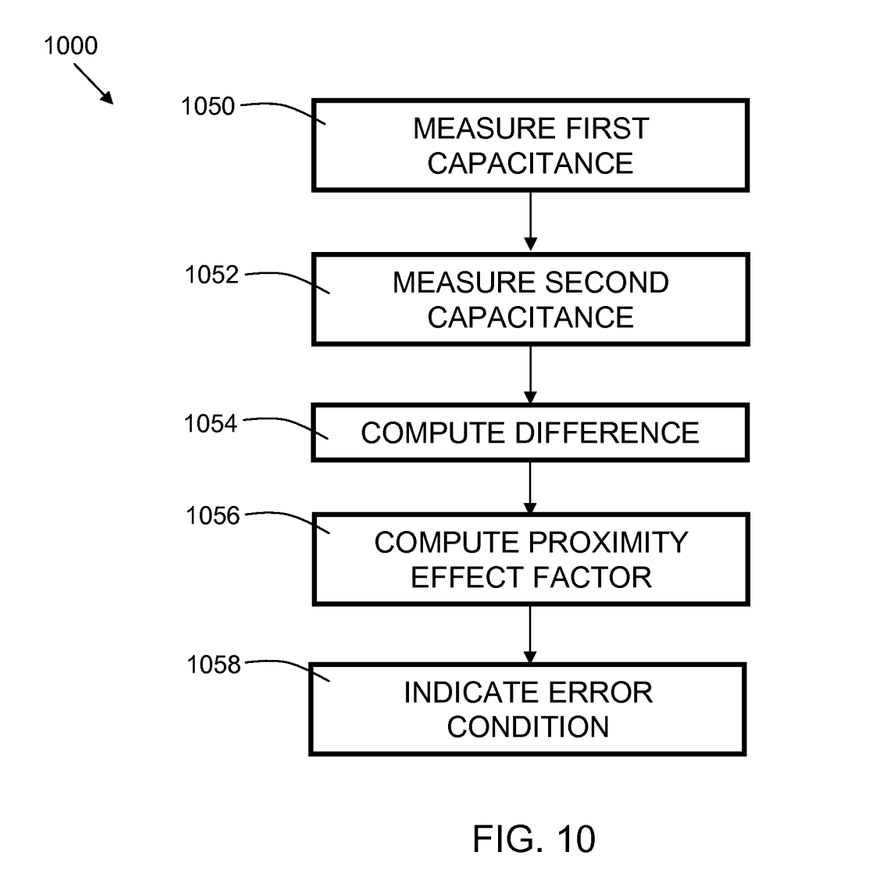
FIG. 10 is a flowchart indicating process steps for embodiments of the present invention.

FIG. 10 is a flowchart 1000 indicating process steps for embodiments of the present invention. In process step 1050, a first capacitance is measured. In process step 1052, a second capacitance is measured. In process step 1054, a difference between measurements is computed. In process step 1056, a proximity effect factor is computed. In process step 1058, an error indication is generated, if the proximity effect factor is outside of a predetermined range. The predetermined range may be derived by measuring one or more "known good" samples to derive an acceptable value for the proximity effect factor.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A through-silicon via (TSV) test structure comprising:
a TSV disposed in a semiconductor substrate; and
a plurality of multilevel test structures disposed adjacent to the TSV, wherein each of the plurality of multilevel test structures occupies at least two metallization levels, wherein each of the plurality of multilevel test structures comprises a stacked via-comb structure, wherein each stacked via-comb structure comprises a plurality of vias and traces configured in an electrical parallel connection, and wherein each of the plurality of stacked via-comb structures are arranged in a staggered configuration.

2. The TSV test structure of claim 1, wherein each of the plurality of multilevel test structures comprises an adjacent multi-plate structure comprising at least two plates on a first metallization level and at least two plates on a second metallization level, wherein the second metallization level is adjacent to the first metallization level.

3. The TSV test structure of claim 1, wherein each of the plurality of multilevel test structures are arranged concentrically around the TSV, and wherein each multilevel test structure has a unique TSV distance.

4. The TSV test structure of claim 3, wherein the plurality of multilevel test structures are arranged in a square configuration.

5. The TSV test structure of claim 3, wherein the plurality of multilevel test structures are arranged in a conformal configuration.

6. The TSV test structure of claim 3, wherein a first subset of the plurality of multilevel test structures are disposed inside of a keep-out zone of the TSV, and wherein a second subset of the plurality of multilevel test structures are disposed outside of a keep-out of the TSV.

7. An integrated circuit comprising:
a non-transitory memory;
a processor configured and disposed to access the non-transitory memory;
a bias control circuit;
a measurement circuit;
a TSV test structure comprising:
a TSV disposed in a semiconductor substrate; and
a plurality of multilevel test structures disposed adjacent to the TSV, wherein each of the plurality of multilevel test structures occupies at least two metallization levels; and
wherein each of the plurality of multilevel test structures comprise a stacked via-comb structure, wherein each stacked via-comb structure comprises a plurality of vias and traces configured in an electrical parallel connection, and wherein each of the plurality of stacked via-comb structures are arranged in a staggered configuration.

8. The integrated circuit of claim 7, wherein each of the plurality of multilevel test structures are arranged concentrically around the TSV, and wherein each multilevel test structure has a different TSV distance.

9. The integrated circuit of claim 7, wherein the plurality of multilevel test structures are arranged in a square configuration.

10. The integrated circuit of claim 7 wherein the plurality of multilevel test structures are arranged in a conformal configuration.

11. The integrated circuit of claim 7, wherein a first subset of the plurality of multilevel test structures are disposed inside of a keep-out zone of the TSV, and wherein a second subset of the plurality of multilevel test structures are disposed outside of a keep-out zone of the TSV.

12. The integrated circuit of claim 7, wherein the non-transitory memory contains instructions that, when executed by the processor, performs a process of:
recording an initial capacitance reading from the measurement circuit in a non-volatile memory;

obtaining an additional capacitance reading from the measurement circuit at a predetermined time interval;

computing a difference between the additional capacitance reading and the initial capacitance reading; and generating an error indication in response to the difference exceeding a predetermined range.

\* \* \* \* \*